United States Patent
Binek et al.

(10) Patent No.: US 11,233,192 B1
(45) Date of Patent: Jan. 25, 2022

(54) HALL BAR DEVICE FOR MEMORY AND LOGIC APPLICATIONS

(71) Applicant: BOARD OF REGENTS OF THE UNIVERSITY OF NEBRASKA, Lincoln, NE (US)

(72) Inventors: Christian Binek, Lincoln, NE (US); Ather Mahmood, Lincoln, NE (US); William Echtenkamp, Lincoln, NE (US)

(73) Assignee: BOARD OF REGENTS OF THE UNIVERSITY OF NEBRASKA, Lincoln, NE (US)

(*) Notice: Subject to any disclaimer, the term of this patent is extended or adjusted under 35 U.S.C. 154(b) by 0 days.

(21) Appl. No.: 16/988,085

(22) Filed: Aug. 7, 2020

(51) Int. Cl.
| | |
|---|---|
| *G11C 11/00* | (2006.01) |
| *H01L 43/02* | (2006.01) |
| *C01G 37/027* | (2006.01) |
| *H01L 43/10* | (2006.01) |
| *H01L 43/08* | (2006.01) |
| *G11C 11/16* | (2006.01) |
| *H01F 1/00* | (2006.01) |

(52) U.S. Cl.
CPC ............ *H01L 43/02* (2013.01); *C01G 37/027* (2013.01); *G11C 11/161* (2013.01); *H01F 1/0009* (2013.01); *H01L 43/08* (2013.01); *H01L 43/10* (2013.01)

(58) Field of Classification Search
CPC ......... H01L 43/02; H01L 43/06; H01L 43/08; H01L 43/10; G11C 11/161; G11C 11/18
See application file for complete search history.

(56) References Cited

U.S. PATENT DOCUMENTS

| | | | | |
|---|---|---|---|---|
| 9,276,040 B1* | 3/2016 | Marshall | ................. | H01L 43/08 |
| 9,718,700 B2 | 8/2017 | Binek et al. | | |
| 2009/0279353 A1* | 11/2009 | Worledge | ............ | G11C 11/1675 365/171 |
| 2009/0315088 A1* | 12/2009 | Xi | ............ | G11C 11/22 257/295 |
| 2015/0243414 A1* | 8/2015 | Binek | .................. | H01F 1/0009 252/62.51 C |
| 2018/0033954 A1* | 2/2018 | Aradhya | ............ | H01F 10/3272 |
| 2018/0130511 A1* | 5/2018 | Belashchenko | ..... | G11C 11/1675 |

OTHER PUBLICATIONS

Nikhil Rangarajan et al. "SMART: Secure Magnetoelectric AntifeRromagnet-Based Tamper-Proof Non-Volatile Memory", IEEE Access, Feb. 20, 2019, 7 pages.
Tobias Kosub et al. "Purely antiferromagnetic magnetoelectric random access memory", Nature Communications, Jan. 3, 2017, 7 pages.
Xin Fan et al. "Observation of the nonlocal spin-orbital effective field", Nature Communications, Apr. 30, 2013, 7 pages.

* cited by examiner

*Primary Examiner* — Toan K Le
(74) *Attorney, Agent, or Firm* — Talem IP Law, LLP

(57) ABSTRACT

A hall bar device for a memory or logic application can include a gate electrode, a boron-doped chromia layer on the gate electrode; and a hall bar structure with four legs on the boron-doped chromia layer. For a memory application, the hall bar device can be written to by applying a pulse voltage across the gate electrode and one leg of the hall bar structure in the absence of an applied magnetic field; and can be read from by measuring a voltage across the one leg of the hall bar structure and its opposite leg.

11 Claims, 6 Drawing Sheets

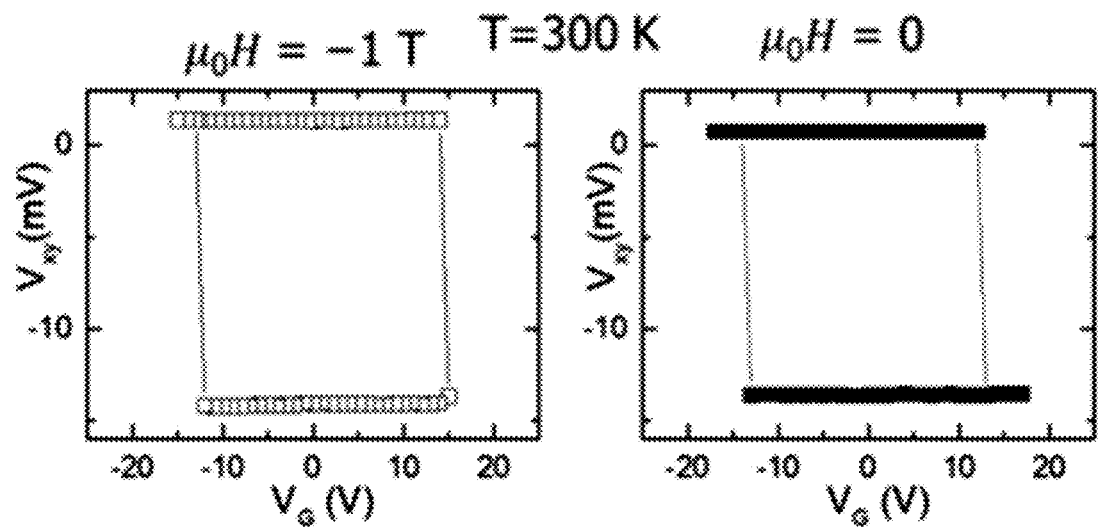
Figure 4A
Figure 4B
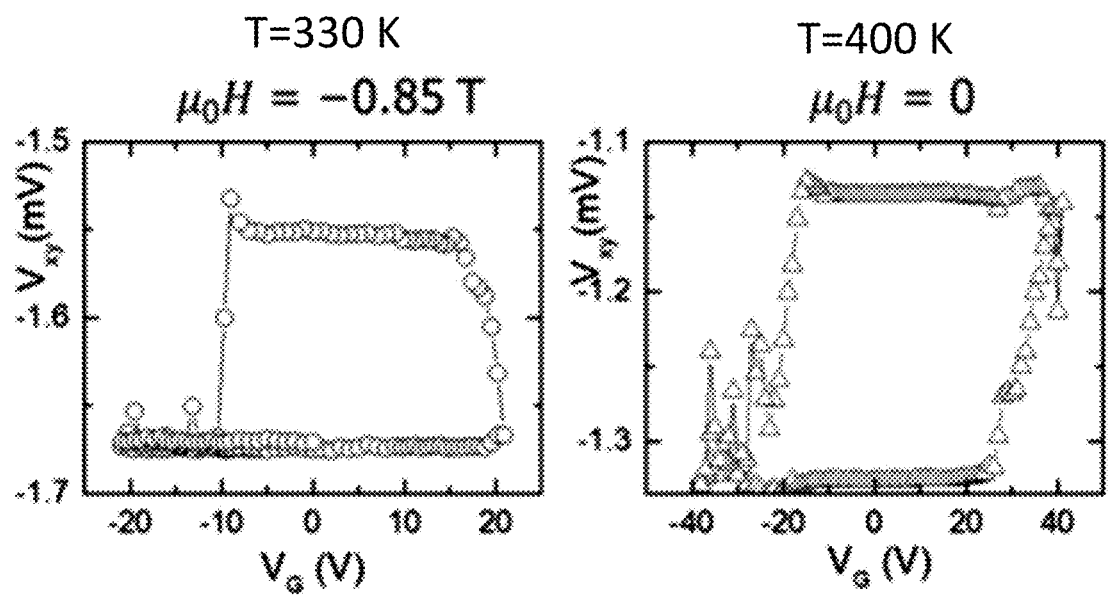
Figure 4C
Figure 4D

HALL BAR DEVICE FOR MEMORY AND LOGIC APPLICATIONS

STATEMENT REGARDING FEDERALLY SPONSORED RESEARCH

This invention was made with government support under ECCS1542182 awarded by the National Science Foundation, under ECCS1740136 awarded by the National Science Foundation, under DMR1420645 awarded by the National Science Foundation, under W911NF-16-1-0472 awarded by the Army Research Office, and under HR0011-18-3-004 awarded by the Department of Defense/Defense Advanced Research Projects Agency. The government has certain rights in the invention.

BACKGROUND

Voltage-controlled magnetoelectric devices have been of interest for next-generation electronics systems due to their potential to store and compute data with minimal power consumption.

BRIEF SUMMARY

A hall bar device for memory and logic applications can be formed of boron-doped chromia. Early research into such devices describe applying a magnetic field; however, it was discovered that switching operations can be accomplished using only an electric field and not a magnetic field. The boron-doped chromia layer of the hall bar device can be used to hold a non-volatile electrical state in the absence of an applied magnetic field and can do so above room temperature. These features can make it attractive for use in computer memory applications.

A hall bar device for memory and logic applications can include a gate electrode, a boron-doped chromia layer on the gate electrode, and a hall bar structure with four legs on the boron-doped chromia layer, where a ferromagnetic state of the boron-doped chromia layer is controlled by a voltage applied across the gate electrode and one leg of the hall bar structure and is read out by a voltage across the one leg of the hall bar structure and its opposite leg while a read-out current is applied at one of the legs orthogonal to the one leg and its opposite leg to generate an in-plane current density.

A method of operating a hall bar device for a memory application can include writing to the hall bar device by applying a pulse voltage across the gate electrode and one leg of the hall bar structure in the absence of an applied magnetic field; and reading from the hall bar device by measuring a voltage across the one leg of the hall bar structure and its opposite leg.

The hall bar device can be provided in plurality, for example as part of a memory array. The memory array can, in some cases, be integrated with a complementary metal oxide semiconductor (CMOS) device for supporting address selection and the writing and reading control.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIGS. 4A-4D show hysteresis loops. FIGS. 4A and 4B show hysteresis loops depicting the relationship between a readout voltage ($V_{xy}$) and a gate voltage ($V_G$) in the presence and absence of a magnetic field applied along a c-axis for the first prototype device; and FIGS. 4C and 4D show hysteresis loops depicting the relationship between $V_{xy}$ and $V_G$ in the presence and absence of a magnetic field applied along a c-axis for the second prototype device.

DETAILED DESCRIPTION

A hall bar device for memory and logic applications can be formed of boron-doped chromia. The boron-doped chromia layer of the hall bar device can be used to hold a non-volatile electrical state in the absence of an applied magnetic field and can do so above room temperature. These features can make it attractive for use in computer memory applications.

Figure 1B:
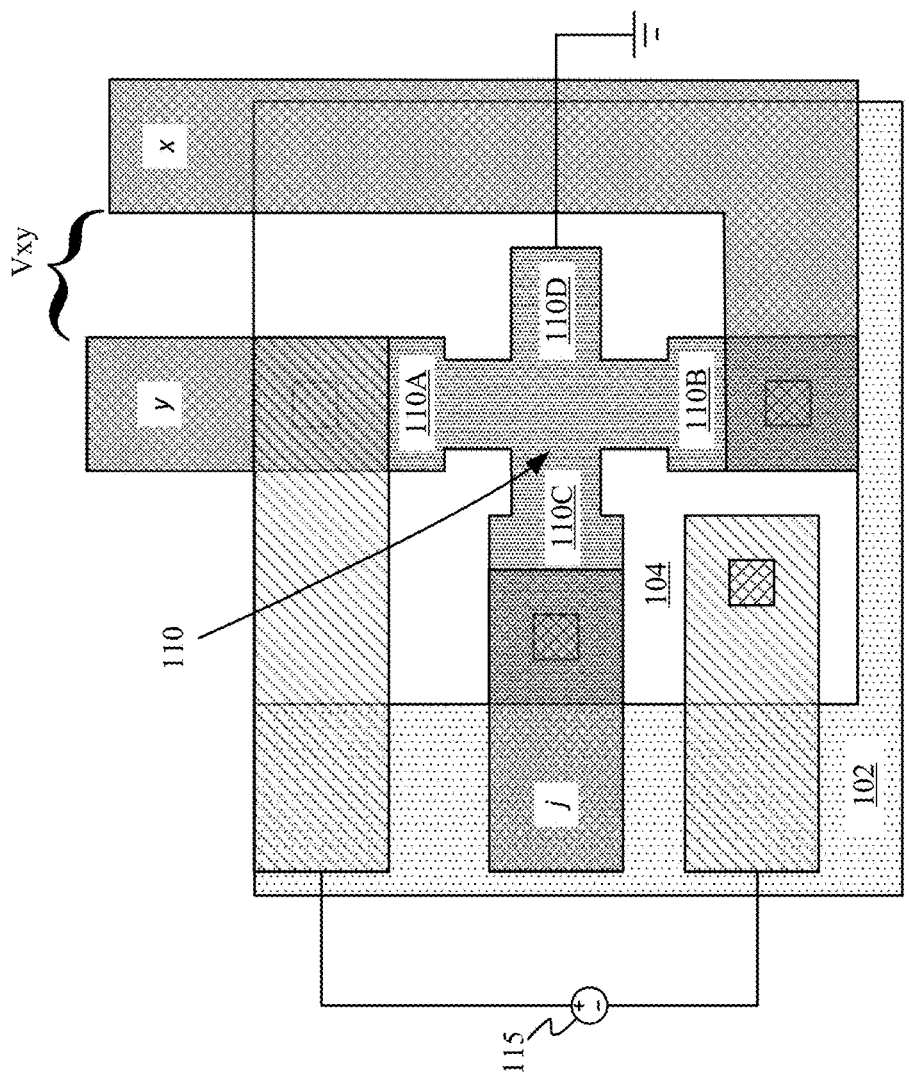
FIGS. 1A-1C illustrate representations of a hall bar device for memory and logic operations.
Figure 1A:
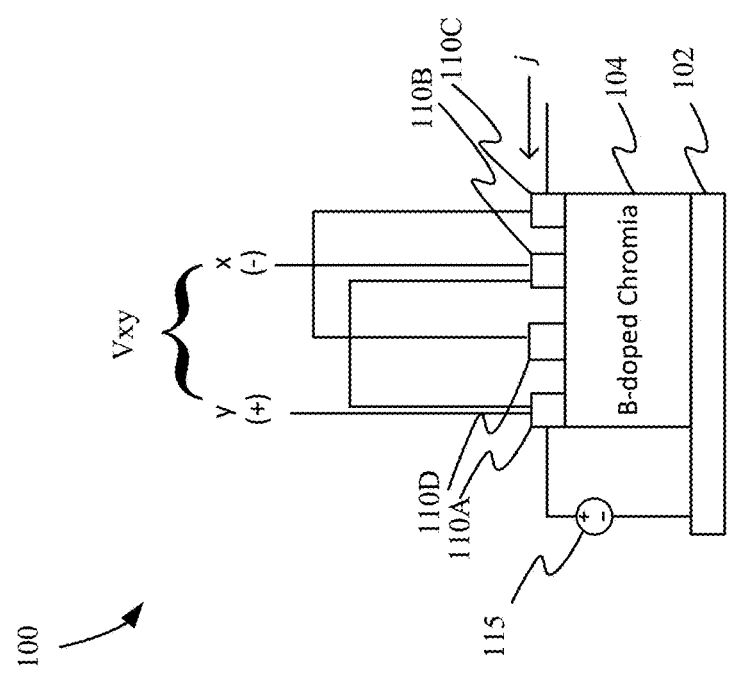
Figure 1C:
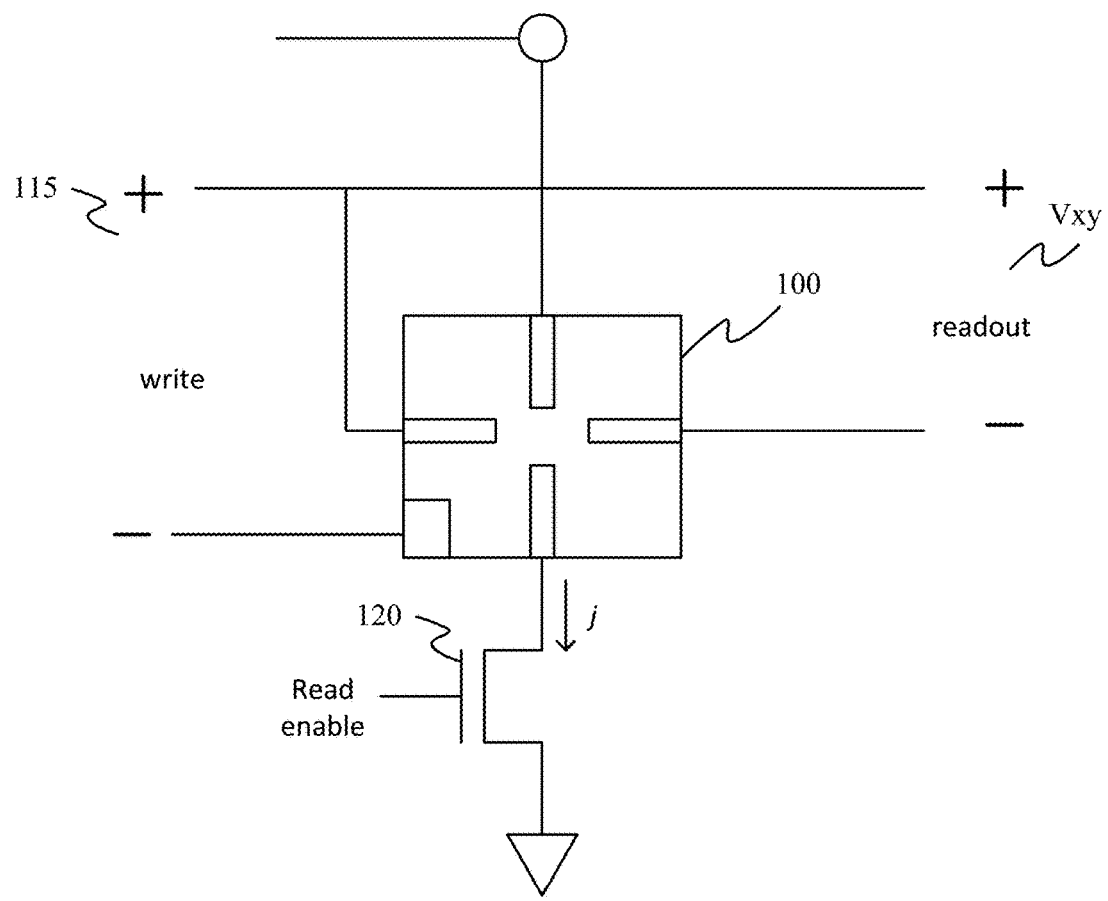

FIGS. 1A and 1B illustrate representations of a hall bar device for memory and logic operations. FIG. 1A shows a representational elevation view; FIG. 1B shows a representational layout view (sizes and shapes of lines, contacts, and legs are not to scale and are merely intended to show connections for ease of understanding; for example, readout contacts may be located at an edge of the feet instead of centrally positioned in a square shape as shown); and FIG. 1C illustrates a schematic representation of the hall bar device for memory and logic applications. Referring to FIGS. 1A and 1B, a hall bar device 100 can include a gate electrode 102, a boron-doped chromia layer 104 on the gate electrode, and a hall bar structure 110 with four legs 110A, 110B, 110C, and 110D in a cross formation, on the boron-doped chromia layer 104. The boron-doped chromia layer 104 can hold a non-volatile electrical state unless acted upon, allowing it to be used as a storage, for instance as a portion of a memory or logic device.

With reference to FIGS. 1A-1C, the ferromagnetic state of the boron-doped chromia layer, which corresponds to a stored logical "0" or "1", is controlled by a first voltage 115 (e.g., as $V_G$) applied across the gate electrode 102 and one leg 110A of the hall bar structure 110 and is read out by detecting a voltage across the one leg 110A of the hall bar structure and its opposite leg 110B (e.g., as $V_{xy}$) while a read-out current (which may be controlled by a read enable signal and switch 120) is applied at one of the legs (leg 110C) orthogonal to the one leg 110A and its opposite leg 110B to generate an in-plane current density j. The device 100 is operated in the absence of an applied magnetic field and can be written to solely in the presence of an electric field. For example, a voltage pulse applied at first voltage 115 can be used to write a '0' or a '1'. The device 100 can be used to hold a non-volatile electric state (e.g., representing the logical '0' or '1') and, as such, can be used as a non-volatile memory cell. The memory cell can be read, for example, by measuring the voltage across the one leg 110A of the hall bar structure and its opposite leg 110B. A readout circuit may be coupled to the device.

By using boron-doped chromia, the device can be operated at temperatures above 300K. With reference to FIG. 1C, a memory device can be implemented by an array of hall bar devices as configured in the drawing and where at least one CMOS device is coupled to the array. The switch 120 may be a NMOS transistor and may be used to support reading control. Not shown are devices that may be used for address selection.

The gate electrode 102 can be formed of vanadium (III) oxide ($V_2O_3$).

The hall bar structure 110 can be formed of a nonmagnetic heavy metal such as platinum. The use of platinum as the material of the hall bar structure minimizes the introduction of additional magnetism. In some implementations, the hall bar legs 110A, 110B, 110C, and 110D have a width of at least 1.0 µm. In some implementations, the hall bar legs 110A, 110B, 110C, and 110D have a width of at least 1.5 µm.

A method of operating a hall bar device 100 for a memory application can include writing to the hall bar device 100 by applying a pulse voltage across the gate electrode 102 and one leg 110A of the hall bar structure in the absence of an applied magnetic field; and reading from the hall bar device 100 by measuring a voltage across the one leg 110A of the hall bar structure and its opposite leg 110B.

Experimental Methods and Prototype Devices

Figure 2A:
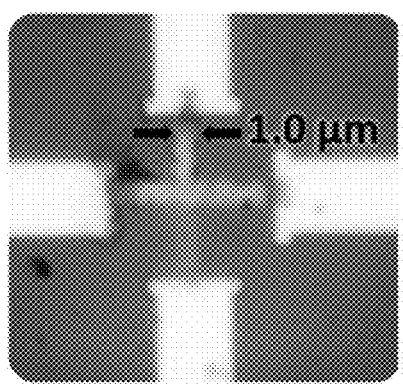
FIGS. 2A and 2B show optical images of two representative prototype devices.
Figure 2B:
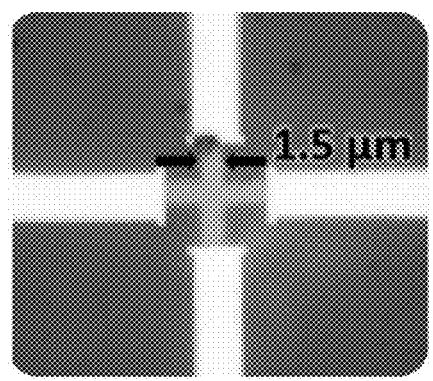

Several devices were fabricated. FIGS. 2A and 2B show optical images of two representative prototype devices; FIG. 2A shows an image of a first prototype device and FIG. 2B shows an image of a second prototype device with wider legs. The first prototype device was fabricated with a 5 nm thick Pt Hall-cross with 2 orthogonal legs of 8.0 µm×1.0 µm. The second prototype device was fabricated with a 5 nm thick Pt Hall-cross with 2 orthogonal legs of 8.0 µm×1.5 µm.

Here, the antiferromagnetic constituent films of the exchange bias heterostructures were grown by pulsed laser deposition (PLD). PLD in ultra-high vacuum was used to grow (0001)-oriented films of the sesquioxides $V_2O_3$ and subsequently, in the presence of a decaborane background gas, B-doped chromia. The $V_2O_3$ film, which was grown on the c-plane of a sapphire single crystalline substrate, serves as bottom electrode in a gated Hall bar structure. A 5 nm Pt film was deposited via DC magnetron sputtering on top of the B-doped chromia film and various Hall crosses were lithographically patterned. The Hall cross serves as readout device which detects the voltage-controlled antiferromagnetic states of the chromia film.

Figure 3A:
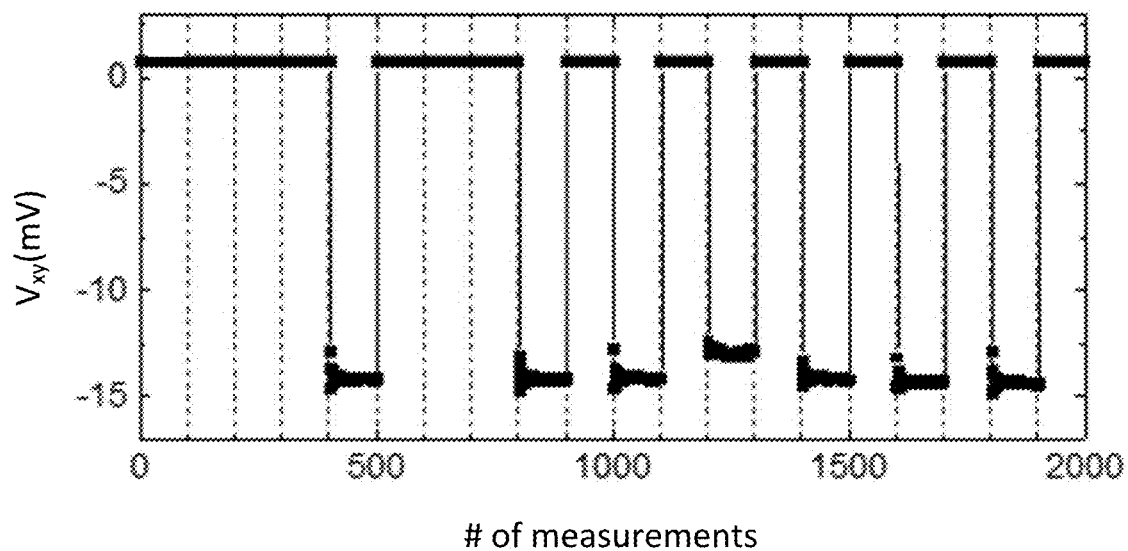
FIGS. 3A and 3B show plots of $V_{xy}$ over the number of measurements taken at T=300 K with a readout current of 20 nA for the first prototype device.
Figure 3B:
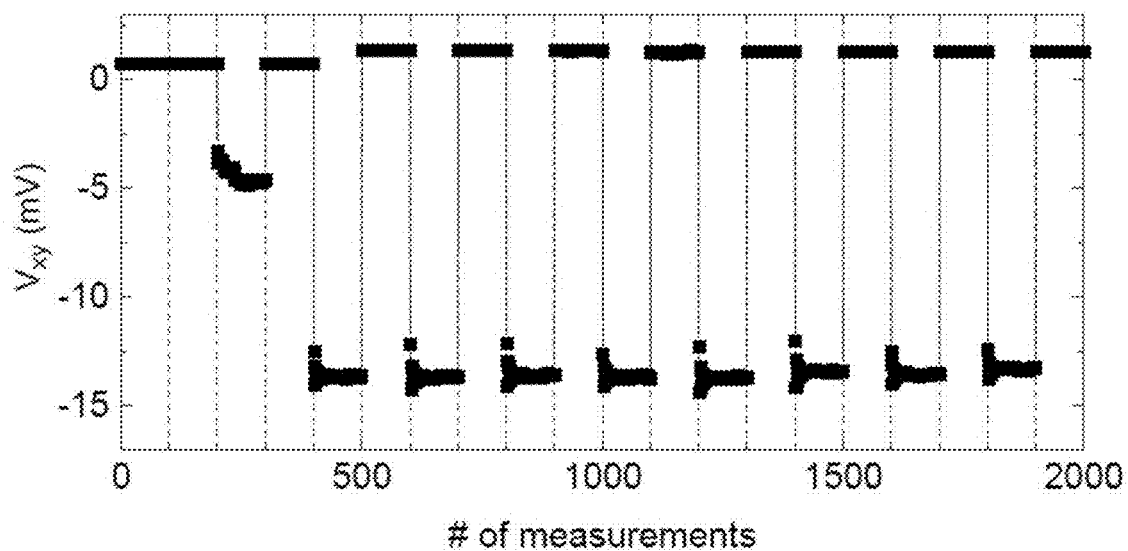

FIGS. 3A and 3B show plots of $V_{xy}$ over the number of measurements taken at T=300 K with a readout current of 20 µA for the first prototype device. Vertical dashed lines indicate respective application of unipolar voltage pulses ($V_G$=±25 V) were applied. Measurements are shown in the absence of an applied magnetic field, indicating deterministic switching. The sequence of measurements is numbered and the Hall signal $V_{xy}$ is shown as a function of this numbering. Hundred subsequent Hall measurements in zero field were performed to determine a baseline for $V_{xy}$ associated with a particular AFM state. After every hundredth point, a voltage pulse of $V_G$=±25 V was applied across the AFM film for a duration of Δt=4 s. The applied voltage gives rise to an electric field, E. After exposing the AFM film to the E-field, 100 subsequent data points are taken at E=0. For FIG. 3A, the measurements were taken while H=0T (a zero applied magnetic field). For FIG. 3B, the measurements were taken while $\mu_0H$=−1T.

The data in FIGS. 3A and 3B demonstrate that a voltage pulse, $V_G$, can switch $V_{xy}$ and thus the AFM spin structure of the B-doped chromia film. Thus, the device can be written to by applying a voltage pulse to $V_G$. In addition, the signal switching is independent of the presence of an applied magnetic field.

FIGS. 4A-4D show hysteresis loops. FIGS. 4A and 4B show hysteresis loops depicting the relationship between $V_{xy}$ and $V_G$ in the presence and absence of a magnetic field applied along a c-axis for the second prototype device; and FIGS. 4C and 4D show hysteresis loops depicting the relationship between a readout voltage ($V_{xy}$) and a gate voltage ($V_G$) in the presence and absence of a magnetic field applied along a c-axis for the first prototype device. The measurements for $V_{xy}$ were taken after $V_G$ was applied as a pulse and removed.

FIG. 4A depicts a hysteresis loop of $V_{xy}$ versus $V_G$ measured at T=300 K in the presence of a magnetic field ($\mu_0H$=−1 T) applied along the c-axis of the second prototype device. FIG. 4B depicts a hysteresis loop of $V_{xy}$ versus $V_G$ measured at T=300 K in the absence of a magnetic field (H=0) for the second prototype device. Well-defined transitions at coercive voltages of about ±15V can be seen. The deterministic switching as seen in FIGS. 4A and 4B can be advantageous for memory applications. Advantageously, the switching occurs both in the presence and absence of magnetic field, indicating that the devices do not require magnetic field to perform switching action.

FIG. 4C depicts a hysteresis loop of $V_{xy}$ versus $V_G$ measured at T=330 K in the presence of a magnetic field ($\mu_0H$=−0.85 T) applied along the c-axis of the first prototype device. FIG. 4D depicts a hysteresis loop of $V_{xy}$ versus $V_G$ measured at T=400 K in the absence of a magnetic field (H=0) for the first prototype device. As can be seen by the hysteresis loops of FIGS. 4C and 4D, the devices are robust and can perform at higher temperatures such as 330 K and even 400 K.

As can be seen by comparing FIG. 4A to 4B and FIG. 4C to 4D, a magnetic field does not need to be applied for the device to function.

Figure 5B:
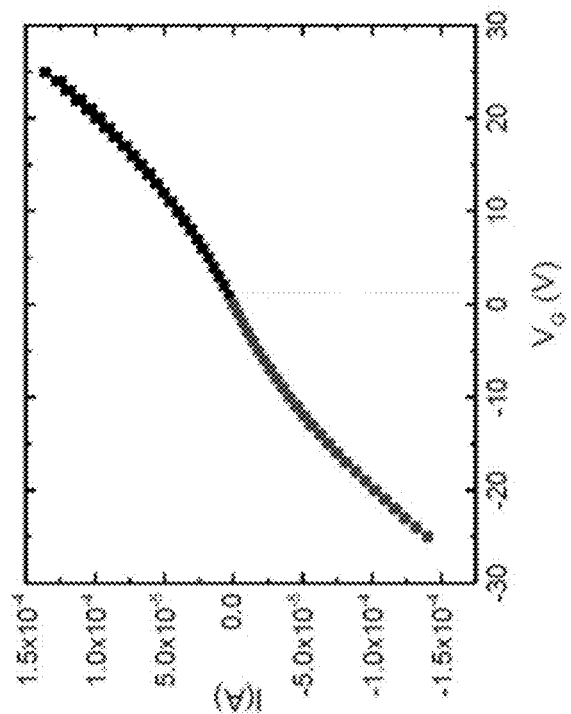
FIGS. 5A and 5B show IV hysteresis curves for the first and second prototype devices, respectively.
Figure 5A:
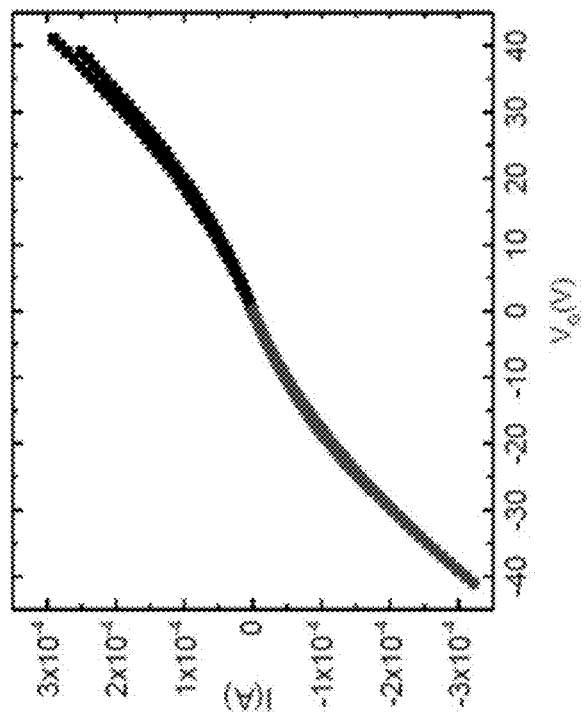

FIGS. 5A and 5B show IV hysteresis curves for the first and second prototype devices, respectively. For the measurements, at T=300 K, the variable gate voltage, $V_G$ was applied across the B-doped chromia films of 200 nm thickness using the top Pt Hall bar and the $V_2O_3$ bottom film as electrodes. The non-Ohmic I-V characteristic resembles the semiconducting nature of the B-doped chromia film. The I-V data together with the Hall bar geometries allow to calculate the leakage current densities j=I/A flowing through the B-doped chromia film with A being the area of the respective Hall cross.

Figure 6:
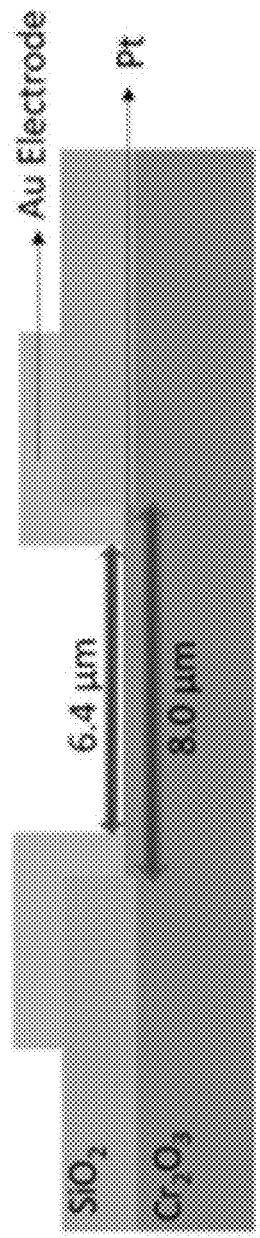
FIG. 6 shows the cross-section of a schematic of the lithographically fabricated Hall bar structure.

FIG. 6 shows the cross-section of a schematic of the lithographically fabricated Hall bar structure.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

What is claimed is:

1. A hall bar device for memory and logic applications, comprising:
   a gate electrode;
   a boron-doped chromia layer on the gate electrode; and
   a hall bar structure with four legs on the boron-doped chromia layer,
   wherein a ferromagnetic state of the boron-doped chromia layer is controlled by a voltage applied across the gate electrode and one leg of the hall bar structure and is read out by a voltage across the one leg of the hall bar structure and its opposite leg while a read-out current is applied at one of the legs orthogonal to the one leg and its opposite leg to generate an in-plane current density.

2. The hall bar device of claim 1, wherein:
the hall bar structure comprises platinum.

3. The hall bar device of claim 1, wherein:
the gate electrode comprises Vanadium(III) oxide.

4. A memory device, comprising:
an array of hall bar devices, each hall bar device comprising:
- a gate electrode;
- a boron-doped chromia layer on the gate electrode; and
- a hall bar structure with four legs on the boron-doped chromia layer,
- wherein a ferromagnetic state of the boron-doped chromia layer is controlled by a voltage applied across the gate electrode and one leg of the hall bar structure and is read out by a voltage across the one leg of the hall bar structure and its opposite leg while a read-out current is applied at one of the legs orthogonal to the one leg and its opposite leg to generate an in-plane current density.

5. The memory device of claim 4, wherein:
the hall bar structure of each hall bar device comprises platinum.

6. The memory device of claim 4, wherein:
the gate electrode of each hall bar device comprises Vanadium(III) oxide.

7. The memory device of claim 4, further comprising at least one complementary metal oxide semiconductor (CMOS) device coupled to the array of hall bar devices.

8. A method of operating a hall bar device for a memory application, wherein the hall bar device comprises a gate electrode, a boron-doped chromia layer on the gate electrode; and a hall bar structure with four legs on the boron-doped chromia layer, the method comprising:
writing to the hall bar device, the writing comprising applying a pulse voltage across the gate electrode and one leg of the hall bar structure in the absence of an applied magnetic field; and
reading from the hall bar device, the reading comprising measuring a voltage across the one leg of the hall bar structure and its opposite leg.

9. The method of claim 8, wherein the method is performed at a temperature of 300 K-400 K.

10. The method of claim 8, wherein:
the hall bar structure comprises platinum.

11. The method of claim 8, wherein:
the gate electrode comprises Vanadium(III) oxide.

* * * * *